United States Patent [19]
Bernard et al.

[11] Patent Number: 4,494,214
[45] Date of Patent: Jan. 15, 1985

[54] APPARATUS FOR GENERATING SCALED WEIGHTING COEFFICIENTS FOR SAMPLED DATA FILTERS

[75] Inventors: Francis S. Bernard, Brooklyn, N.Y.; Steven M. Eliscu, Ocean; Eric P. Batterman, North Brunswick, both of N.J.

[73] Assignee: RCA Corporation, New York, N.Y.

[21] Appl. No.: 463,613

[22] Filed: Feb. 3, 1983

[51] Int. Cl.³ .............................................. G06F 15/31
[52] U.S. Cl. .................................... 364/724; 333/166
[58] Field of Search ................. 364/724, 825; 333/166

[56] References Cited

U.S. PATENT DOCUMENTS

| | | | |
|---|---|---|---|
| 4,125,866 | 11/1978 | VanEssen et al. | 364/724 |
| 4,136,398 | 1/1979 | Eggermont | 364/724 |
| 4,145,747 | 3/1979 | Sakaki | 364/724 |
| 4,366,547 | 12/1982 | Miller | 364/724 |
| 4,377,793 | 3/1983 | Horna | 333/166 |
| 4,431,976 | 2/1984 | Voorman | 333/166 |

FOREIGN PATENT DOCUMENTS 2080068A 1/1982 United Kingdom.

OTHER PUBLICATIONS

Tang et al., "Coefficient Correction in Programmable C.C.D. Recursive Filters" *Electronics Letters*, vol. 15, No. 20, Sep. 27, 1979, pp. 630-632.

Nakayama, "Permuted Difference Coefficient Digital Filter" *Proceedings of the 1981 IEEE International Conference on Acoustics, Speech & Signal Processing*, Atlanta, GA, Mar. 30, Apr. 1, 1981, pp. 1197-1200.

"CCD Adaptive Filter Employing Parallel Coefficient Updating", Electronic Letters, vol. 15, No. 18, Aug. 1979, pp. 573-575.

*Primary Examiner*—David H. Malzahn
*Attorney, Agent, or Firm*—E. M. Whitacre; P. J. Rasmussen; E. P. Herrmann

[57] ABSTRACT

A method is described for generating continuously variable sets of weighting coefficients for application to weighting circuits of a sampled data filter. The generated coefficients are produced by scaling the time axis of the impulse response described by a set of standard or nominal weighting coefficients in an inverse manner to a desired scaling of the filter frequency response. The coefficient values at the scaled time points are calculated by a piecewise linear interpolation process and correspond to the scaled coefficients. By this technique, a large number of sets of weighting coefficients may be generated from a single set of coefficients with relatively few circuit elements.

13 Claims, 5 Drawing Figures

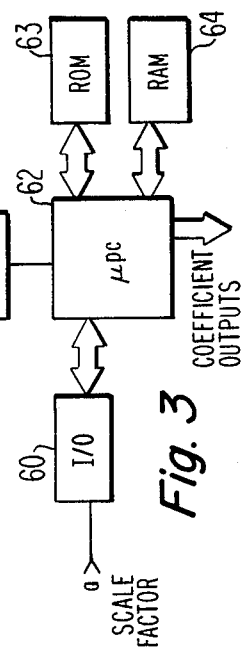
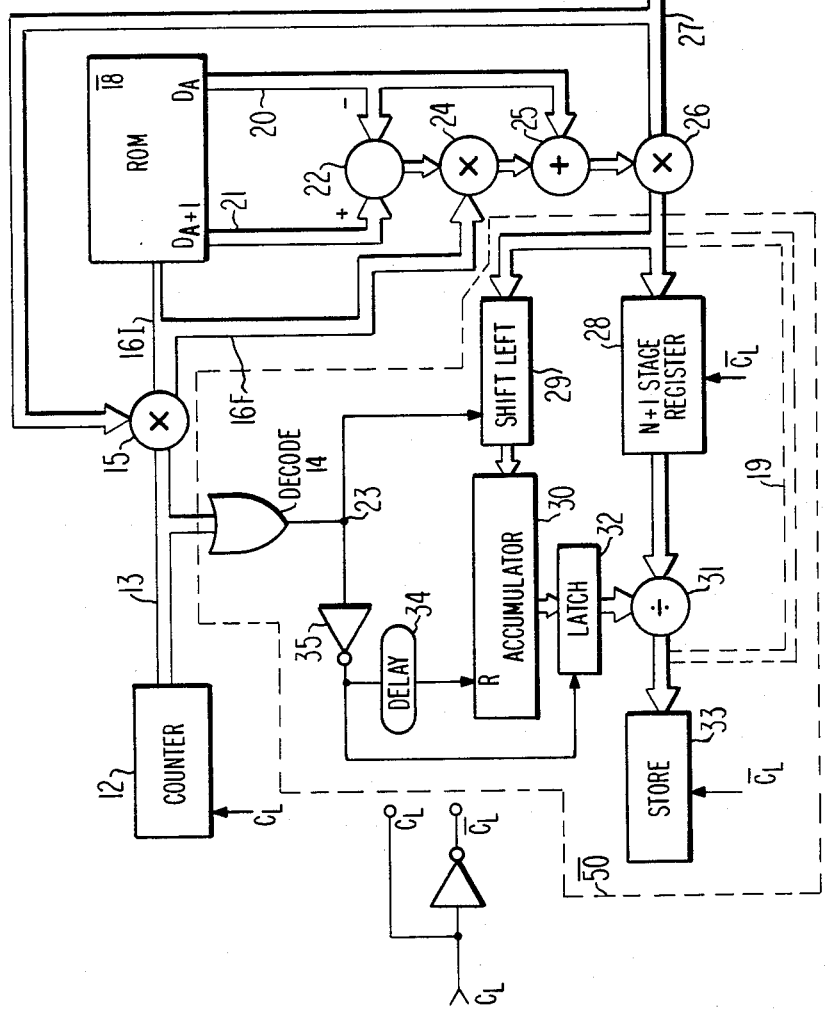
Fig. 2
Fig. 3

APPARATUS FOR GENERATING SCALED WEIGHTING COEFFICIENTS FOR SAMPLED DATA FILTERS

BACKGROUND OF THE INVENTION

This invention relates to adaptive filters and more particularly to apparatus for generating weighting coefficients for sampled data filters such as finite impulse response filters.

Sampled data filters perform weighting and summing operations on successive input samples to produce filtered replicas, y(n), of the input samples, x(n), generally defined by the equation $$y(n) = \sum_{i=0}^{k} a_i x(n-i) - \sum_{i=1}^{k} b_i y(n-i).$$

The factors $a_i$ and $b_i$ are weighting coefficients applied to delayed input and output samples $x(n-i)$ and $y(n-i)$, respectively, where i connotes the number of sample delay periods. The equation defines the transfer function of a recursive filter. If the rightmost term of the equation is eliminated, the equation defines the transfer function of a non-recussive filter.

It will readily be appreciated that the transfer function of a given filter can be altered by changing the value of the weighting coefficients $a_i$ and $b_i$. If apparatus is provided to automatically change the filter weighting coefficients in response to some stimulus, the filter transfer function is advantageously made adaptive. For example, sets of weighting coefficients may be stored in a read only memory (ROM). The stimulus may be arranged to address the ROM to provide particular sets of the coefficients to the filter weighting elements, which coefficients would correspond to particular values of the stimulus. If the stimulus corresponds to the frequency content of the signal being processed by the filter, the bandwidth of the filter can be varied responsive to the signal frequency content to enhance the average signal-to-noise ratio.

ROM's are a convenient media for storing and accessing sets of weighting coefficients in adaptive filter circuits. However, if the desired range of filter adaptability is relatively wide and is to be incremented with relatively fine resolution, the size of the ROM may become excessive. For a filter having 15 taps, i.e., 15 weighting circuits, with each weighting coefficient consisting of a six bit binary number, one set of coefficients requires 90 bit locations in the ROM. As few as eleven sets of coefficients will require over 1,000 bit locations and will provide relatively course vernier resolution.

It is an object of the present invention to generate sets of weighting coefficients which are substantially continuously variable with relatively simple hardware making possible adaptive filters which are substantially continuously variable over a given range.

SUMMARY OF THE INVENTION

The present invention generates sets of sampled data filter weighting coefficients from a single stored set of such coefficients. The weighting coefficients which define the frequency response of a sampled data filter also determine the impulse response of the filter in the time domain. Scaling the frequency response of the filter translates to an inverse scaling of the impulse response, and vice-versa. Therefore, the impulse response may be scaled, i.e., coefficient values at intermediate sample points on the impulse response curve selected, to alter the filter frequency response. In the present invention, scaled coefficient values are determined by piecewise linear interpolation of the set of stored coefficient values, according to the equation $$H'(I) = a[(H(K+1) - H(K))F_{Ia} + H(K)]$$

where H'(I) are the scaled coefficient values, a is the scaling factor, I is a simple index value, H(K) is the stored coefficient having the index K equal to the integer part of the product (Ia), H(K+1) is the stored coefficient having the index one greater than H(K), and $F_{Ia}$ is the fractional part of the product (Ia).

BRIEF DESCRIPTION OF THE DRAWINGS

FIGS. 2 and 3 are block diagrams of two circuits for developing sampled data filter weighting coefficients from a unique set of stored coefficients.

DETAILED DESCRIPTION OF THE INVENTION

The time domain and frequency domain functions of a sampled data filter are related by the transform pair given by $$h(t) <=> H(j\omega) \tag{1}$$

where h(t) is the time domain response of the filter to an input impulse excitation and $H(j\omega)$ is the Fourier transform of h(t).

The width of the frequency response may be scaled by reciprocally scaling the impulse response according to the relationship $$h(at) <=> (1/a)H(j\omega/a) \quad a>o \tag{2}$$

where "a" is the scale factor. In order that the amplitude of the frequency response be unaffected by scaling, the transform pair of equation (2) is multiplied by the scale factor resulting in the transform pair $$ah(at) <=> H(j\omega/a) \quad a>o \tag{3}.$$

Consider a finite impulse response (FIR) filter having a linear phase response. Such a device consists of a tapped delay line with weighting elements coupled to the taps and means for summing the weighted output samples from all of the weighting elements. The weighting coefficients for a linear phase FIR filter are symmetrical about the center tap. The envelope or curve defined by the value of the weighting coefficients describes the time domain response curve of the filter, i.e., the impulse response.

Figure 1A:
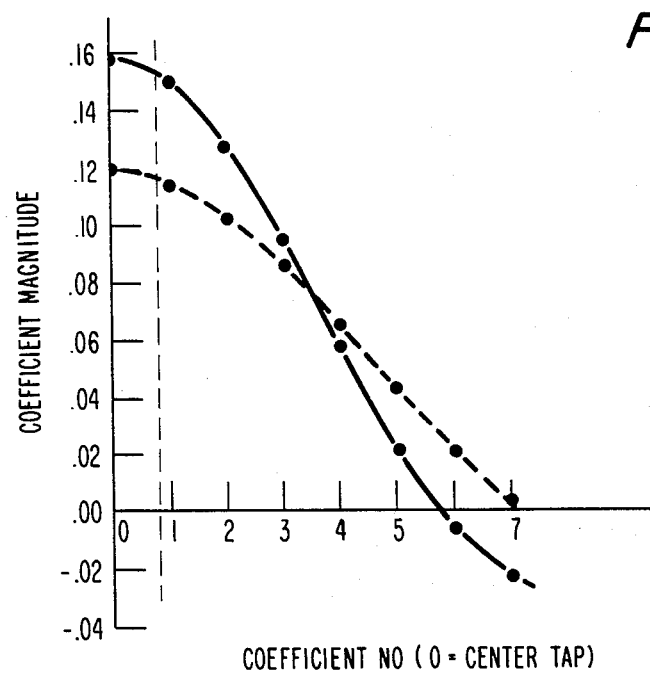
FIG. 1a is a graphical illustration of the impulse response of an arbitrary sampled data filter and FIG. 1b is a graphical illustration of the frequency response corresponding to the same arbitrary filter.

FIG. 1A is the impulse response of a particular low pass FIR filter. Only the portion of the response for time, t, greater than zero is illustrated, but it should be remembered that the curve of the impulse response for t>0 is reflected about the vertical axis at t=0. The coefficient magnitude at t=0 corresponds to the weighting coefficient at the center tap of the filter. The sample points on the curve indicate the value of weighting coefficients of successive taps of the filter. For the impulse response illustrated in FIG. 1, the filter has 15 taps, one corresponding to t=0, seven for positive values of t and seven for negative values of t.

The dashed line in FIG. 1A is the impulse response for the same filter with the coefficients scaled by a factor of 0.8. Note that time is normalized to the delay period between taps.

Figure 1B:
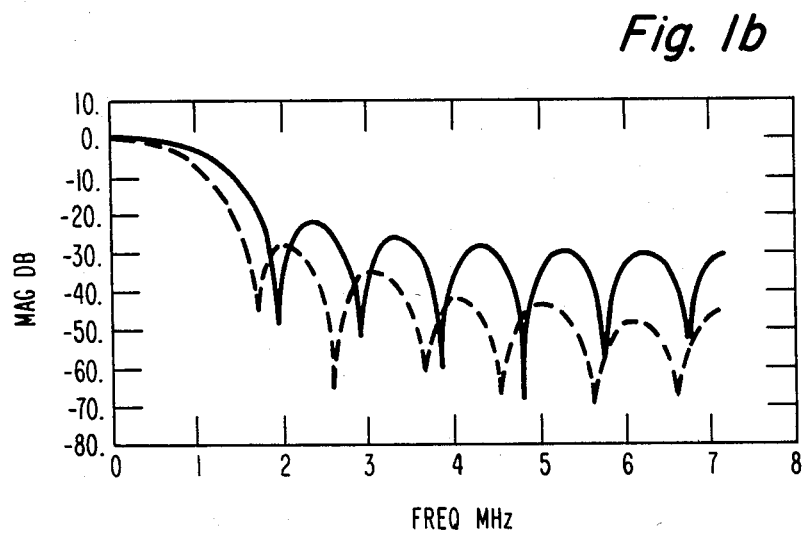

FIG. 1B is the corresponding frequency response for the filter having the FIG. 1A impulse response and the dashed line in FIG. 1B corresponds to the scaled impulse response of FIG. 1A.

The tap points on the filter delay line are located at fixed points on the delay line. The delay between taps are at integral multiples of the sample periods of the signal to be filtered. In order to scale the frequency response according to equation (2) or (3), it is necessary to scale time relative to the impulse response curve. However, as stated above, the tap points are fixed and nominally the sample rate is fixed.

Consider the case where it is desired to narrow the bandwidth of the frequency response of the filter. Because of the inverse scaling of the transform pair, this corresponds to broadening the impulse response over time. For example, if the filter is to be scaled so that the response of the scaled filter at frequency $\omega$ is to equal the response of the unscaled filter at $\omega/a$ $0<a<1$ then the impulse response at time at of the original filter must be translated to the time t in the scaled filter. Referring to FIG. 1, scaling the filter by a factor of 0.8 corresponds to shifting the coefficient value at the time 0.8 to the time t=1 and the value at t=1.6 to the point designated t=2. Graphically, the coefficient values at any time (at) can be picked off the curve describing the impulse response. From the curve in FIG. 1, the coefficient value at t=0.8 is approximately 0.153. From equation 3, this value must be multiplied by the scale factor, in this example 0.8, resulting in the scaled coefficient value of 0.1224. This value would be applied to the weighting circuit at the tap corresponding to t=1. It is noted that this is not the value at t=1 in the scaled curve illustrated by the dashed line. The reason for this is that ultimately the scaled coefficients are normalized so that the sum of all the tap weights equals the value one.

The current invention computes the scaled coefficients by mathmatically extrapolating their values by a piecewise linear calculation using the known coefficient values of an unscaled filter. Starting at t=0, the scaled coefficient is equal to a·h(0). The coefficient at t=0.8 is found by finding the approximate slope of the curve between the known points h(0) and h(1), multiplying it by the distance the scaled time is located from the point in time the scaled time is from the lower coefficient value and adding that value to the value for h(0). In other words, the scaled coefficients are calculated according to the equation y=mx+b where y corresponds to the coefficient value, m is the slope, x corresponds to time between the two coefficients corresponding to the scaled time and b is the intercept, that is the value of the lower of the two unscaled coefficients used in the calculation. The slope is determined by the simple equation $$m = (h(i+1) - h(1))/(t_{i+1} - t_i).$$

However, the denominator $(t_{i+1} - t_i)$ can be made to drop out of the equation for the slope if the distance between the successive tap points is made unity. Thus, to determine the value of the coefficient at point t=0.8, the coefficient value at t=0 is subtracted from the value at t=1, the difference is multiplied by 0.8 and the product is added to the coefficient value at t=0. Using values from FIG. 1A $$h(0.8) = 0.8(0.15 - 0.158) + 0.158 = 0.1516$$

which is within about one percent of the value read from the curve. This value is then multiplied by the scale factor to yield the coefficient to be applied to the weighting circuit at tap point t=1.

FIG. 2 illustrates circuitry for generating scaled coefficients by the foregoing piecewise linear interpolation method. The particular circuitry shown is arranged to produce coefficients for a linear phase filter wherein the weighting coefficients are symmetrically disposed about the center tap. Thus, for an N tap filter it is only necessary to generate (N−1)/2 coefficient values, where N is odd. A slight modification to the circuitry is required for N being even since the number of coefficients required is N/2.

In FIG. 2, a storage device 18 which may be a read only memory (ROM) contains one set of filter coefficients chosen to produce a desired filter characteristic within the range of interest. The particular coefficients within the ROM 18 are accessed by means of address signals A applied on bus 16I. The ROM is designed to concurrently output data D at two output ports $D_A$ and $D_{A+1}$ where the data at port $D_A$ corresponds to the information stored in the ROM storage location currently being addressed, and the data at port $D_{A+1}$ corresponds to the information stored in the ROM storage location having an address equal to the current address incremented by one. The filter coefficients $h_0$, $h_1$, $h_2$, etc. are stored in sequential address locations 0, 1, 2, etc., respectively.

A second storage device 33, which may be a random access memory and supporting addressing circuitry, or a shift register, is included for storing the scaled coefficient values.

The two data output terminals of ROM 18 are coupled to a SUBTRACTOR circuit 22 wherein data from port $D_A$ is subtracted from data at port $D_{A+1}$. The output of the SUBTRACTOR corresponds to the value $h(i+1) - h(i)$ which approximates the slope, m, of the impulse response between the coefficient values currently addressed.

The output value, "m", from SUBTRACTOR 22 is applied to one input of a MULTIPLIER circuit 24. A proportionality factor "x" from connection 16F is applied to a second input of the MULTIPLIER circuit 24, the output of which is the product (m·x). The product (m·x) is applied to one input connection of ADDER circuit 25. The data from the currently addressed storage location in ROM 18 is applied to a second input connection of ADDER 25. Since the interpolation is being performed in a piecewise linear manner between each set of points, i.e., between sets of coefficients h(i) and h(i+1), the leftmost coefficient (h(i)) of each pair of coefficients on the impulse response curve represents the "b" intercept for the particular calculation. Therefore, the sum produced by ADDER 25 corresponds to the value (m·x)+b or in terms of filter coefficients is (h(i+1) − h(i))x + h(i).

The output value from ADDER 25 is coupled to a first input connection of the MULTIPLIER circuit 26.

The scaling factor "a" on bus 27 is applied to a second input connection of MULTIPLIER 26 which produces the product $$h' = a[(h(i+1) - h(i))x + h(i)] \tag{4}$$

where h' is equivalent to the value of a scaled coefficient.

The scale factor source may be, for example, a keyboard and latch for manually producing a binary number and incrementing and decrementing that number. On the other hand, it may be apparatus which determines the signal-to-noise ratio of the filtered signal and generates a scale factor in accordance with the current signal-to-noise ratio. If the scale factor "a" is an analog variable, then the scale factor source may include an analog-to-digital converter.

Next, we shall consider the proportionality factor "x" and the ROM 18 addressing apparatus. Assume the filter has N taps so that (N+1)/2 scaled coefficients are to be generated and assume that the scale factor is 0.2. The scaled coefficients h(at) for t=0, 1, 2, 3, etc. occur on the impulse response curve corresponding to the stored coefficients in ROM 18 at points corresponding to t=0.0, 0.2, 0.4, 0.6, etc. The first six scaled coefficient values are located on the unscaled (hereinafter "standard") impulse response between t equal zero and one. For all values of a·t between zero and one, the approximate slope of the standard impulse response is determined from the standard coefficients h(0) and h(1), i.e., $m_{0-1} = h(1) - h(0)$. Similarly, for scaled coefficients corresponding between points t equal to one and two on the standard curve, the approximate slope of the curve is determined from coefficients h(1) and h(2). Since the distance between points on the standard impulse response is unity, the value of "x" by which the slope segments are to be multiplied is equal to the fractional part of the product (a·t).

In FIG. 2, the ROM 18 addresses, and the "x" values, are generated by a binary COUNTER 12 and a binary MULTIPLIER 15. COUNTER 12 is responsive to a clock signal CL, which may be a square wave, and generates at its output connection 13 a sequence of binary numbers of values 0, 1, 2, 3 ... N+1 after which it resets and commences a new sequence 0, 1, 2, 3 ... N+1 etc. The binary sequence from the COUNTER is applied to the MULTIPLIER 15. The scale factor "a" is applied to a second input of the MULTIPLIER 15. The output of MULTIPLIER 15 is a binary sequence corresponding to the sequence produced by the COUNTER 12 but multiplied by the scale factor "a". MULTIPLIER 15 is designed with sufficient resolution and range to accommodate the desired resolution and range of the scale factor for the numbers 0 to N+1 produced by the COUNTER. This means that while the COUNTER may only have signal bits to accommodate integer numbers, the MULTIPLIER has output bit positions for both integer and fractional numbers.

The integer bits 16I of the MULTIPLIER 15 output connection are connected to the address input terminal, of the ROM. Thus, for values of (at) less than one, the address applied to the ROM is the value zero. For $1 \leq (at) < 2$, the address applied to ROM 18 is the value one and so one.

The output bits, 16F, corresponding to the fractional part of the product produced by MULTIPLIER 15 represent the value "x" in the sum (m·x)+b. Therefore, the fractional bits 16F from multiplier 15 are connected as the "x" input to MULTIPLIER 24.

The circuit described thus far may be operated to continuously calculate sets of scaled coefficients which may be stored directly in the storage element 33 (as indicated by the phantom bus connections 19). However, the scaling factor will generally result in truncation of the scaled impulse response and so it is desirable to normalize the scaled coefficients. For example, if the sum of the standard coefficients was made equal to one because of hardware constraints within the filter, it may be desirable that the sum of the scaled coefficients also equals one. The coefficient normalization is performed by the circuitry circumscribed in the dashed block 50.

In circuit 50, the value of all of the coefficients is accummulated in ACCUMMULATOR 30. After the value of the last scaled coefficient of a set is included in the sum, the total value of the scaled coefficients is dumped into the LATCH 32. As the respective scaled coefficients are input to the ACCUMMULATOR, they are also stored in the SHIFT REGISTER 28 where they are stored in sequence while the sum is being totalized. Each scaled coefficient of the sequence is then shifted out of register 28 and divided by the total sum of the sequence in circuit 31. The normalized scaled coefficients are thereafter stored, for subsequent use, in the storage element 33. In the embodiment shown, it will be noted that the circuitry 50 is clocked antiphase to the counter. This provides time for propogation of the signal through elements 15, 18, 22, 24, 25 and 26.

It will be remembered that the total number of coefficients is N but only (N+1)/2 scaled coefficients were calculated due to the symmetry of coefficient values about the center tap. Thus, in the normalization process, it is necessary to add the value of the scaled coefficients twice or to multiply each coefficient (except the center coefficient) by the factor 2. Binary numbers may be multiplied by 2 simply by shifting their bit positions leftward one bit position. Element 29 between the ACCUMMULATOR 30 and MULTIPLIER 26 performs a one bit left shift on the scaled coefficients when the signal at its control input connection 23 is high. Element 29 passes the binary number at its input connection unaltered when the signal on the control input is low. A decoder 14, which may be a conventional OR gate coupled to the output of counter 12, will produce a high output signal for all binary output numbers greater than zero and a low output signal for a binary output number equal to zero. Decoder 14 may therefore be utilized to control the SHIFT LEFT circuit 29 to double all the scaled coefficients except the coefficient corresponding to h(0).

The output of the OR gate 14 is complemented in INVERTOR circuit 35 to reset the accummulator at the beginning of each number sequence and latch the accummulated number therein into the LATCH circuit at the end of each sequence. (Note the end of one sequence corresponds to the beginning of the next.) A delay 34 is interposed between INVERTOR 35 and the reset input terminal (R) of the ACCUMMULATOR 30 to insure that the contents therein are transferred to the LATCH 32 before the accummulator is reset to zero.

Referring to FIG. 3, a microprocessor and support hardware is configured to perform the function of the FIG. 2 circuit. The microprocessor 62 which may be an RCA Corporation CDP 1802 COSMAC Microprocessor, stimulated by oscillator 61 cycles through program steps stored in ROM 63. A set of "standard" coefficients which may be stored in ROM 63 or RAM 64 are scaled in accordance with equation 4 with the computed scaled coefficients being stored in RAM 64. The scaling factor is provided to the microprocessor through the input device 60 which for analog scale factors may include an analog-to-digital converter.

Figure 4:
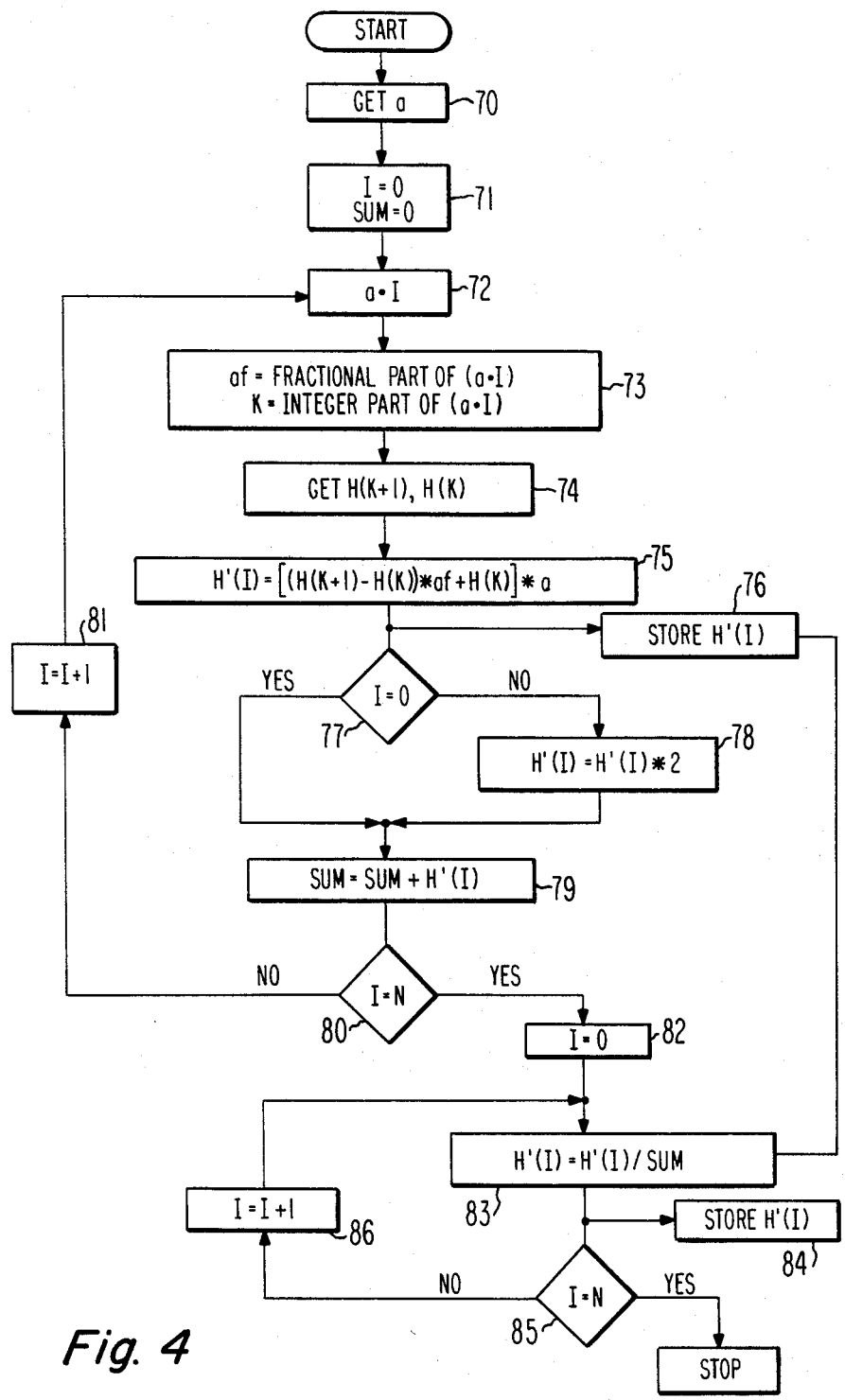
FIG. 4 is a flow chart describing the operational sequence of the FIG. 3 embodiment.

FIG. 4 is a flow chart describing the operation of the FIG. 3 circuit. When the microprocessor (processing means) is directed to compute scaled coefficients, it is first directed to obtain the scale factor (70) and to initialize an index (I) and sum to zero (71). The index (I) is then multiplied by the scale factor (72). The product (a·I) is separated (73) into its integer (K) and fractional parts (a·f). Two of the standard coefficients H(K+1), H(K) are accessed (74) from memory. The scaled coefficient H'(I) is then computed (75) according to the equation $$H'(I) = a[(H(K+1) - H(K))af + H(K)].$$

The scaled coefficient is stored (76) in memory for subsequent normalization. The index I is checked (77) to determine if it is zero. If it is greater than zero, the scaled coefficient is doubled (78) and then summed (79) with the previously calculated scaled coefficients. If the index I is zero, it is placed directly in the accummulator (79). The index I is then checked (80) to determine if the requisite number of scaled coefficients have been computed. If not, the index I is incremented (81) by one and the foregoing steps reiterated. If the desired number of scaled coefficients have been computed then each of the computed coefficients are divided by the sum (83) of all of the scaled coefficients and successively stored (84) in memory for subsequent application to the filter weighting circuits.

The foregoing embodiments describe apparatus for calculating (N+1)/2 scaled weighting coefficients for an N tap filter from (N+1)/2 standard coefficients. It will readily be appreciated that by slight modification of the circuitry, N scaled coefficients may be calculated from N standard coefficients for an N tap filter and thus the invention is applicable for calculating scaled coefficients for filters having other than symmetrical coefficients.

What is claimed is:

1. Apparatus for generating scaled weighting coefficients for sampled data filters from a set of N standard weighting coefficients, comprising:

means for storing said standard coefficients, wherein said standard coefficients are indexed in a predetermined sequence;

a terminal for applying a scale factor "a";

means for generating a sequence of numbers corresponding to the index values of the standard coefficients;

means coupled to said terminal and to said means for generating a sequence of numbers for generating the products of the scale factor times each of said numbers of said sequence wherein each product has an integer part K and a fractional part F;

means coupled to said means for storing said standard coefficients, to said terminal and responsive to said products for calculating a value for each number in said sequence according to the equation $$H'(I) = a[(H(K+1) - H(K))F + H(K)]$$

where H'(I) equals a scaled coefficient for a number in said sequence I, H(K) is a standard coefficient with index K and H(K+1) is a standard coefficient with index K+1; and means coupled to said calculating means for storing the scaled coefficients H'(I).

2. The apparatus as set forth in claim 1 further including;

means coupled to said calculating means for generating the sum of the scaled coefficients;

means coupled to said calculating means and the means for generating the sum of the scaled coefficients for dividing each of said scaled coefficients by said sum thereby normalizing each scaled coefficient; and means for coupling said dividing means to the means for storing said scaled coefficients for use in a sampled data filter.

3. The apparatus set forth in claim 1 wherein the means for generating the sequence of numbers comprises:

a source of clock signal;
   a binary counter responsive to said clock signal.

4. The apparatus set forth in claim 1 wherein the means for generating the products of the scale factor times each number is a binary multiplier having parallel output bit lines, respective ones of said output lines corresponding to the integer part of said products and respective ones of said output lines corresponding to the fractional part of said products.

5. The apparatus set forth in claim 1 wherein the means for storing the standard coefficients is a memory device responsive to the integer part of said products for producing at respective output terminals the standard coefficient having an index value K equal to said integer and the standard coefficient having an index value K+1 corresponding to said integer incremented by one.

6. The apparatus set forth in claim 5 wherein the means for calculating the products H'(I) comprises:

a subtraction circuit having first and second input connections to said memory device for applying the standard coefficients having index values K and K+1 and producing at an output connection thereof the difference (H(K+1)−H(K));

a first multiplier circuit having an output connection, and having first and second input connections respectively coupled to the output connection of said subtraction circuit, and to the means for generating products for applying the fractional values F of said products;

an addition circuit having an output connection, and having first and second input connections respectively coupled to the output connection of said first multiplying circuit and to the memory device output terminal producing the standard coefficient H(K); and a second multiplying circuit having first and second input connections respectively coupled to said terminal for applying said scale factor and to the output connection of said addition circuit, said second multiplying circuit producing at an output terminal thereof, said scaled coefficients.

7. Apparatus for generating sets of scaled weighting coefficients for a sampled data filter from a set of standard coefficients and a scale factor comprising:

means for storing said standard coefficients, wherein said standard coefficients are successively indexed, according to their relative position of application in said filter, said standard coefficients being denoted H(K) where K is an index variable;

means for storing said scaled coefficients H'(I) where I is an indexing variable;

a connection for applying a scale factor "A";

processing means coupled to said connection and to said means for storing said standard coefficients, and preprogrammed to generate a sequence of successive index numbers I, multiplying each number I of said sequence by the scale factor A, calculating the scaled coefficients according to the equation $$H'(I) = A[(H(K+1) - H(K))F + H(K)]$$

where K equals the integer part of A times I, the product of the scale factor times the number I of the index sequence, and F is the fractional part of the product of A times I, and applying the calculated values H'(I) to the means for storing the scaled coefficients.

8. The apparatus set forth in claim 7 wherein the processing means is a microprocessor.

9. The apparatus set forth in claim 8 wherein the means for storing the standard coefficients is a Read Only Memory.

10. The apparatus set forth in claim 8 wherein the means for storing the scaled coefficients is a Random Access Memory.

11. The apparatus set forth in claim 8 wherein the processing means is further preprogrammed to normalize the scaled coefficients by summing the values of all the coefficients in a set and dividing each scaled coefficient by the sum of the coefficient value.

12. A method for generating scaled weighting coefficients H'(I) for application to weighting circuits of a sampled data filter, from a set of standard weighting coefficients H(K) predetermined to produce a nominal desired frequency response from said filter, comprising:

storing a set of standard weighting coefficients;

calculating said scaled coefficients by linearly interpolating values from successive pairs of said standard weighting coefficients, said interpolated values corresponding to values of the filter impulse response described by said standard coefficients at points in time corresponding to the relative time position of the standard coefficients multiplied by the scale factor.

13. The method set forth in claim 12 wherein the interpolation comprises:

storing said standard coefficients H(K) indexed with variables K;

generating a sequence of variables I;

multiplying each variable I by the scale factor A;

determining the integer part K and the fractional part F of the products of A times I; and calculating the respective scaled coefficients H'(I) according to the equation $$H'(I) = A[(H(K+1) - H(K))F + H(K)].$$

* * * * *